United States Patent
Ting et al.

(10) Patent No.: US 10,096,765 B2
(45) Date of Patent: Oct. 9, 2018

(54) PIEZOELECTRIC ENERGY HARVESTER

(71) Applicant: Chung-Yuan Christian University, Tao Yuan County (TW)

(72) Inventors: Yung Ting, Tao Yuan County (TW); Sheuan-Perng Lin, Tao Yuan County (TW); Chih-Hsuan Yu, Tao Yuan County (TW); Chien-Wen Wang, Tao Yuan County (TW)

(73) Assignee: CHUNG-YUAN CHRISTIAN UNIVERSITY, Taoyuan County (TW)

( * ) Notice: Subject to any disclaimer, the term of this patent is extended or adjusted under 35 U.S.C. 154(b) by 228 days.

(21) Appl. No.: 15/270,424

(22) Filed: Sep. 20, 2016

(65) Prior Publication Data

US 2017/0324022 A1 Nov. 9, 2017

(30) Foreign Application Priority Data

May 6, 2016 (TW) .............................. 105114237 A

(51) Int. Cl.
*H01L 41/113* (2006.01)
*H02N 2/18* (2006.01)
*H01L 41/053* (2006.01)

(52) U.S. Cl.
CPC .......... *H01L 41/113* (2013.01); *H01L 41/053* (2013.01)

(58) Field of Classification Search
CPC ........ H01L 41/113; H01L 41/053; H02N 2/18

USPC ......................................................... 310/339
See application file for complete search history.

(56) References Cited

U.S. PATENT DOCUMENTS

| | | | |
|---|---|---|---|
| 2009/0309458 A1* | 12/2009 | Chou ....................... | H02N 2/18 310/339 |
| 2013/0257219 A1* | 10/2013 | Monfray ................... | H02N 2/18 310/306 |
| 2013/0280549 A1* | 10/2013 | Monfray ................... | H02N 2/18 428/603 |
| 2016/0156287 A1* | 6/2016 | Yang .................... | H01L 41/1136 310/339 |
| 2017/0331397 A1* | 11/2017 | Kim ......................... | H02N 1/04 |
| 2018/0123484 A1* | 5/2018 | Peace ....................... | H02N 2/18 |

* cited by examiner

*Primary Examiner* — J. San Martin
(74) *Attorney, Agent, or Firm* — Muncy, Geissler, Olds & Lowe, P.C.

(57) ABSTRACT

A piezoelectric energy harvester has a box, a plurality of first arc-shaped metal stands and a plurality of arc-shaped piezoelectric elements. The box has an upper portion, a connection base, a buffer element and a lower portion. The connection base situates between the upper portion and the lower portion. The upper portion movably connects with the lower portion through the buffer element. The plurality of first arc-shaped metal stands situated on a side of the connection base in the box. Each of the arc-shaped piezoelectric elements locates on each of the first arc-shaped metal stands. When an external force applied on the box, the plurality of first arc-shaped metal stands deforms due to the compression from the upper portion and consequently causes the deformation of the arc-shaped piezoelectric elements for generating electricity accordingly.

10 Claims, 5 Drawing Sheets

PIEZOELECTRIC ENERGY HARVESTER

BACKGROUND OF THE INVENTION

1. Field of the Invention

The present invention relates to a piezoelectric energy harvester, particularly to a piezoelectric energy harvester having a plurality of arc-shaped piezoelectric elements.

2. Description of the Related Art

An energy harvester gathers surrounding energy, converts the energy into electricity, and provides the electricity to an electronic device connected therewith. For example, a solar panel that converts light energy into electricity is a kind of energy harvester. In consideration of the current development of energy harvesting technology, the electricity generated by an energy harvester cannot be supplied to electronic devices with large power consumption for use. However, with the rapid development of science and technology and environmental issues gradually being taken seriously, the potential technology development of the energy harvester is still worthy of further research and development.

SUMMARY OF THE INVENTION

It is a major objective of the present invention to provide a piezoelectric energy harvester having a plurality of arc-shaped piezoelectric elements.

To achieve the above objective, the piezoelectric energy harvester of the present invention includes a box, a plurality of first arc-shaped metal stands, and a plurality of arc-shaped piezoelectric elements. The box includes an upper portion, a connection base, a buffer element, and a lower portion. The connection base is situated between the upper portion and the lower portion. The upper portion is movably connected to the lower portion though the buffer element. The plurality of first arc-shaped metal stands is situated on a side of the connection base in the box. Each of the arc-shaped piezoelectric elements is located on each of the first arc-shaped metal stands. When an external force is applied to the box, the upper portion deforms due to the compression from the upper portion and consequently causes the deformation of the arc-shaped piezoelectric elements for generating electricity accordingly.

In the piezoelectric energy harvester of the present invention, the arc-shaped piezoelectric elements are situated on the arc-shaped metal stands. When the arc-shaped metal stands are forced to deform such that the arc-shaped piezoelectric elements deform, the mechanical energy can be converted into electricity through the piezoelectric effect. According to an embodiment of the present invention, the piezoelectric energy harvester of the present invention can be provided in the heel. With each walk, the compression to the heel caused by the user's foot enables the piezoelectric energy harvester to generate electricity.

DETAILED DESCRIPTION OF THE PREFERRED EMBODIMENT

Hereafter, the technical content of the present invention will be better understood with reference to preferred embodiments. Please refer to FIGS. 1, 2a and 2b for a schematic drawing of a piezoelectric energy harvester according to a first embodiment of the present invention, a cross-sectional drawing of the piezoelectric energy harvester, and a cross-sectional drawing when the piezoelectric energy harvester is compressed by an external force.

Figure 1:
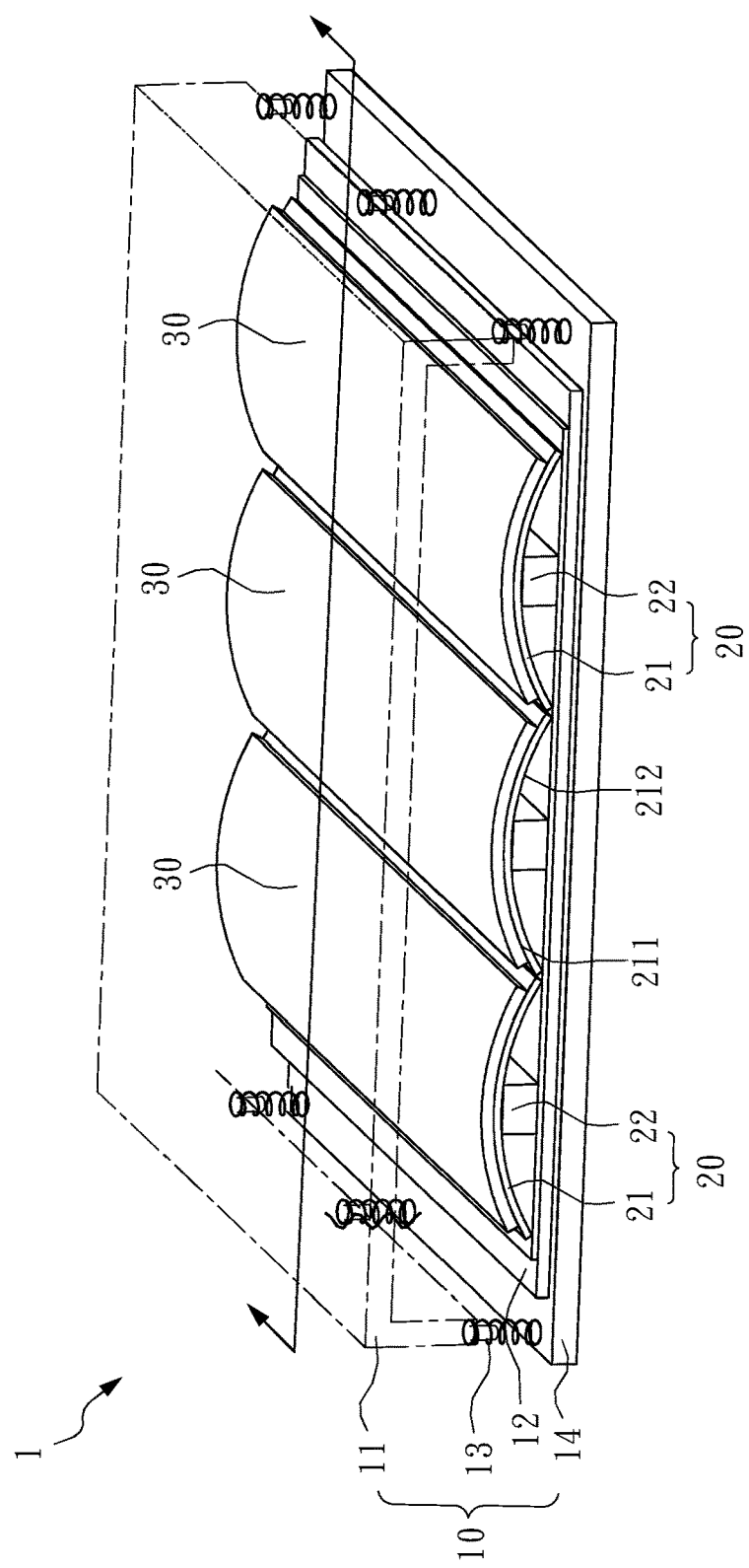
FIG. 1 is a schematic drawing of a piezoelectric energy harvester according to a first embodiment of the present invention.
Figure 2A:
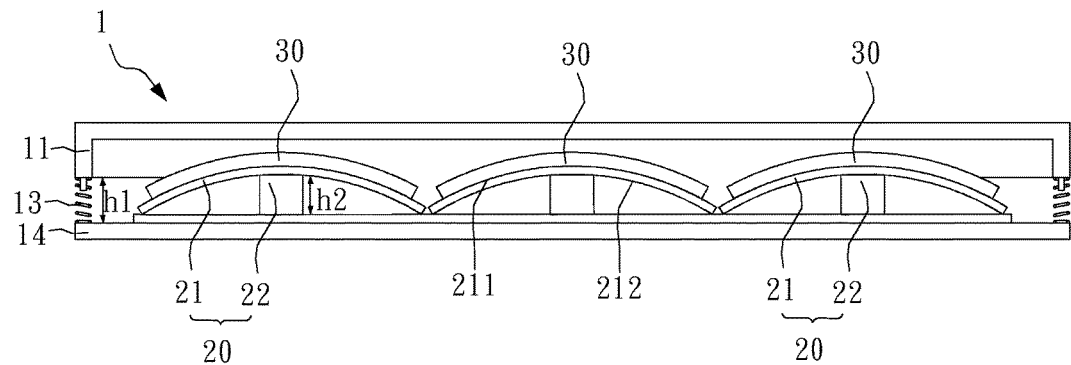
FIG. 2a is a cross-sectional drawing of a piezoelectric energy harvester according to the first embodiment of the present invention.
Figure 2B:
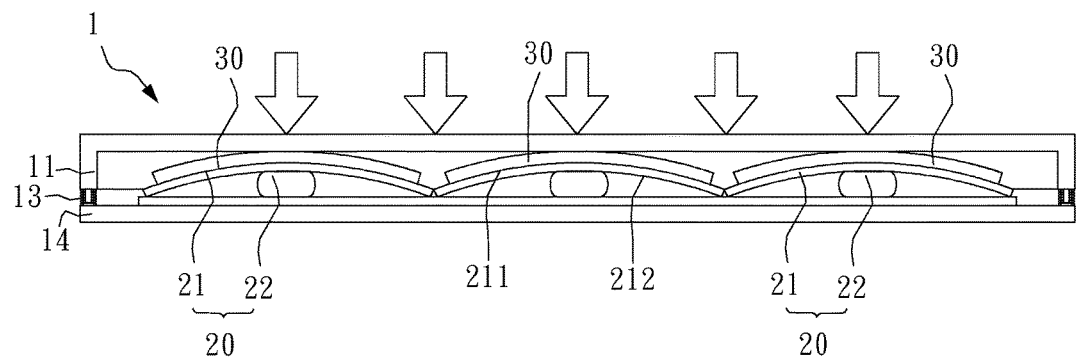
FIG. 2b is a cross-sectional drawing showing a piezoelectric energy harvester being compressed by an external force according to the first embodiment of the present invention.

As shown in FIGS. 1, 2a and 2b, a piezoelectric energy harvester 1 in the present invention includes a box 10, a plurality of first arc-shaped metal stands 20, and a plurality of arc-shaped piezoelectric elements 30, wherein the plurality of first arc-shaped metal stands 20 is situated in the box 10. Each of the arc-shaped piezoelectric elements 30 is situated on each of the first arc-shaped metal stands 20. When an external force is applied to the box 10, the plurality of first arc-shaped metal stands 20 are compressed to deform, such that the plurality of arc-shaped piezoelectric elements 30 deform to generate electricity due to the piezoelectric effect. In the present embodiment, the arc-shaped piezoelectric elements 30 are d31 mode piezoelectric ceramics.

As shown in FIGS. 1, 2a and 2b, in the present embodiment, the box 10 is a rectangle and includes an upper portion 11, a connection base 12, a buffer element 13 and a lower portion 14. The connection base 12 is situated between the upper portion 11 and the lower portion 14. The plurality of first arc-shaped metal stands 20 is situated on a side of the connection base 12. The upper portion 11 is movably connected to the lower portion 14 through the buffer element 13. When an external force is applied to the box 10, the buffer element 13 is used as a buffer to reduce the impact caused by the external force between the upper portion 11 and the lower portion 14. In the present embodiment, the buffer element 13 is a spring. When the upper portion 11 is not compressed by an external force, the buffer element 13 has a first height h1, but the present invention is not limited thereto. The buffer element 13 may also be other type of buffer element, such as rubber. In the present embodiment, as shown in FIGS. 2a and 2b, when an external force is applied to the box 10, the upper portion 11 moves downward to compress the buffer element 13. At this time, the buffer element 13 is in a compressed state. When the external force is released, the buffer element 13 is restored to the first height h1 through the elastic restoring force, such that the upper portion 11 is restored to its original height.

As shown in FIGS. 1, 2a and 2b, in the present embodiment, each of the first arc-shaped metal stands 20 includes a curved plate 21 and a restoring element 22. Specifically, the opposite ends of the restoring element 22 are connected to the curved plate 21 and the connection base 12 respectively. When an external force is not applied to the box 10, the restoring element 22 has a second height h2. The first height h1 is greater than the second height h2, thereby providing the first arc-shaped metal stands 20 with sufficient deformation space and moving stroke. As shown in FIGS. 1, 2a and 2b, in the present embodiment, the curved plate 21 includes a convex surface 211 and a concave surface 212. Specifically, each of the arc-shaped piezoelectric elements 30 are situated on the convex surface 211 of each said first arc-shaped metal stands 20. The opposite ends of the restoring element 22 are connected to the concave surface 212 and the connection base 12 respectively.

As shown in FIG. 2b, when an external force is applied to the box 10, the curved plate 21 and the restoring element 22 deform due to the compression of the upper portion 11. Since each of the arc-shaped piezoelectric elements 30 situated on the curved plate 21 would deform due to the deformation of the curved plate 21, the mechanical energy can be converted into electricity through the piezoelectric effect At this time, according to different needs, each of the arc-shaped piezoelectric elements 30 can be electrically connected in series or in parallel to output the electricity generated by the plurality of arc-shaped piezoelectric elements 30. In addition, the rectangular upper portion 11 can transfer the external force evenly and apply the external force to each of the arc-shaped piezoelectric elements 30 to generate voltage signals without any phase difference. This prevents the direction of the external force applied to each of the arc-shaped piezoelectric elements 30 from being different, such that the voltage signals generated by each of the arc-shaped piezoelectric elements 30 have the phase difference to generate mutual offset, resulting in poor energy harvesting effect.

Hereafter, please continue to refer to FIGS. 2a and 2b. Also refer to FIG. 2c, which is a schematic drawing of the arc-shaped piezoelectric elements 30 in the present invention.

Figure 2C:
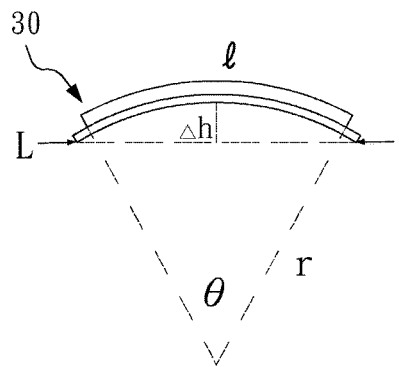
FIG. 2c is a schematic drawing of arc-shaped piezoelectric elements according to the present invention.

As shown in FIG. 2c, the formula for electricity generation of the arc-shaped piezoelectric elements 30 is as follows:

$$Q_t = \frac{Yd_{31}}{2}(LWT)\left[\frac{8T\Delta h}{L^2}\right],$$

where Y is Young's modulus $$(\text{stress/strain}) = \frac{\frac{F}{A}}{S},$$

$d_{31}$ is piezoelectric strain/charge constant (direction d31), L, W and T represent the horizontal length, width and thickness of the arc-shaped piezoelectric elements 30 respectively, and $\Delta h$ is the vertical deformation height of the arc-shaped piezoelectric elements 30. The relationship between the arc radius r, the vertical deformation height $\Delta h$, and the arc length l of the arc-shaped piezoelectric elements 30 is:

$$\Delta h = r\left[1 - \cos\left(\frac{l}{2r}\right)\right].$$

The relationship between the horizontal length L and arc radius r is: $L = 2 \times r \sin \theta$. The arc-shaped piezoelectric elements 30 can be regarded as the equivalent capacitance, the amount of electric charge is $Q = CV$, and the capacitance coefficient is $$C = \frac{LW\varepsilon_0\varepsilon_{31}^T}{T},$$

where $\varepsilon_{31}^T$ is the piezoelectric dielectric constant (direction d31), and the energy harvesting is:

$$\frac{1}{2}CV^2 = \frac{1}{2}\frac{Q^2}{C} = \frac{1}{2\left(\frac{LW\varepsilon_0\varepsilon_{31}^T}{T}\right)}\left[\frac{Yd_{31}}{2}(LWT)\left(\frac{8T\Delta h}{L^2}\right)\right]^2 = 8\frac{Y^2d_{31}^2}{\varepsilon_0\varepsilon_{31}^T} \times \left(\frac{T^5 w\Delta h^2}{L^3}\right).$$

According to the above equation, when considering to use the same material and the width of each said arc-shaped piezoelectric elements is w, the energy harvesting of the piezoelectric energy harvester 1 is proportional to $$\propto \frac{\Delta h^2}{L^3}.$$

The reason why the present invention uses the plurality of arc-shaped piezoelectric elements 30 is, under the premise of the constant $\Delta h$, compared to a single arc-shaped piezoelectric element whose horizontal length is L, the horizontal length of the plurality of (n) arc-shaped piezoelectric elements 30 is $$L \times \frac{1}{n},$$

such that the energy harvesting of the plurality of (n) arc-shaped piezoelectric elements 30 is $n^3$ times of the single arc-shaped piezoelectric element whose horizontal length is L and then superimposed n times. Thus, $n^4$ times of the energy harvesting are increased. Additionally, if $\Delta h$ is different, to use the single arc-shaped piezoelectric element whose horizontal length is L to obtain the energy harvesting same as the plurality of (n) arc-shaped piezoelectric elements 30, the height displacement of a single arc-shaped piezoelectric element needs to be designed as $\sqrt{n^3} \times n = n^2$ in the plurality of (n) arc-shaped piezoelectric elements. However, the increase of height may cause inconvenience to the design of the box 10 and space utilization. Accordingly, in terms of the overall energy harvesting or the design of the box 10, using the plurality of arc-shaped piezoelectric elements 30 is better than using a single arc-shaped piezoelectric element.

Figure 3:
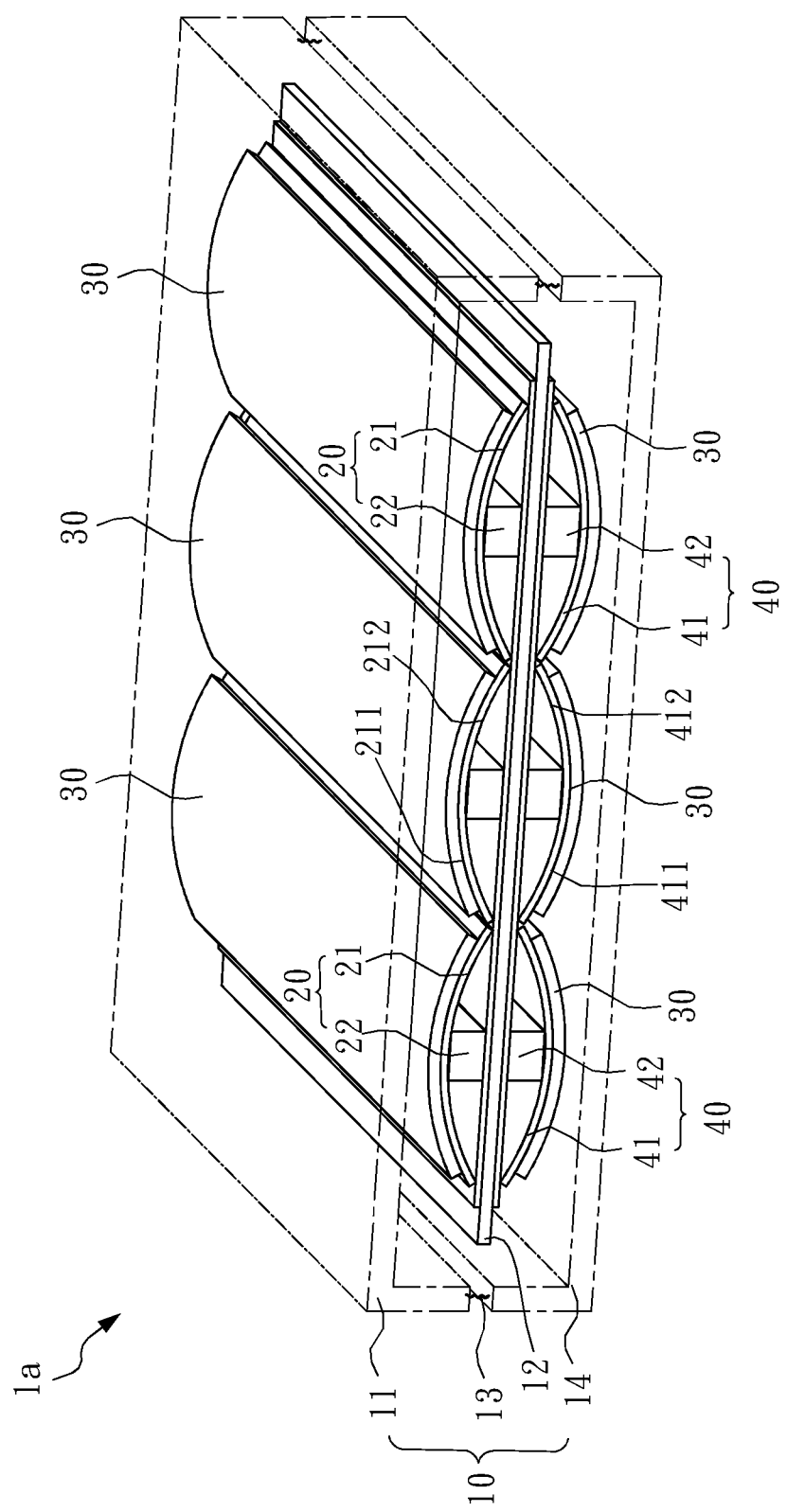
FIG. 3 is a schematic drawing of a piezoelectric energy harvester according to a second embodiment of the present invention.
Figure 4A:
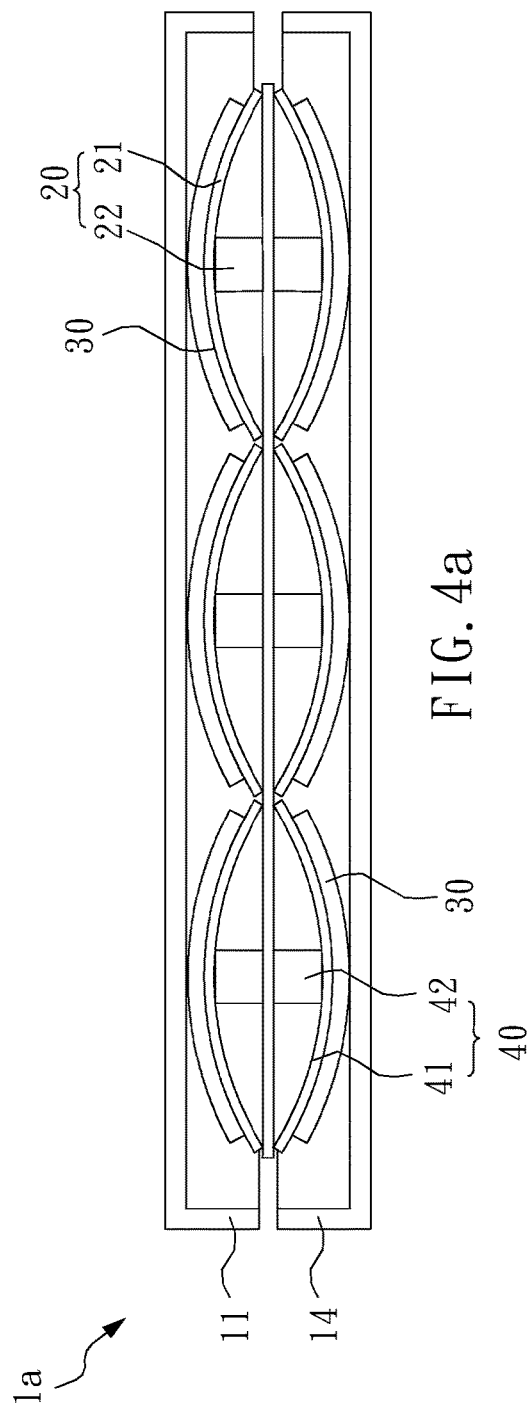
FIG. 4a is a cross-sectional drawing of a piezoelectric energy harvester according to the second embodiment of the present invention.
Figure 4B:
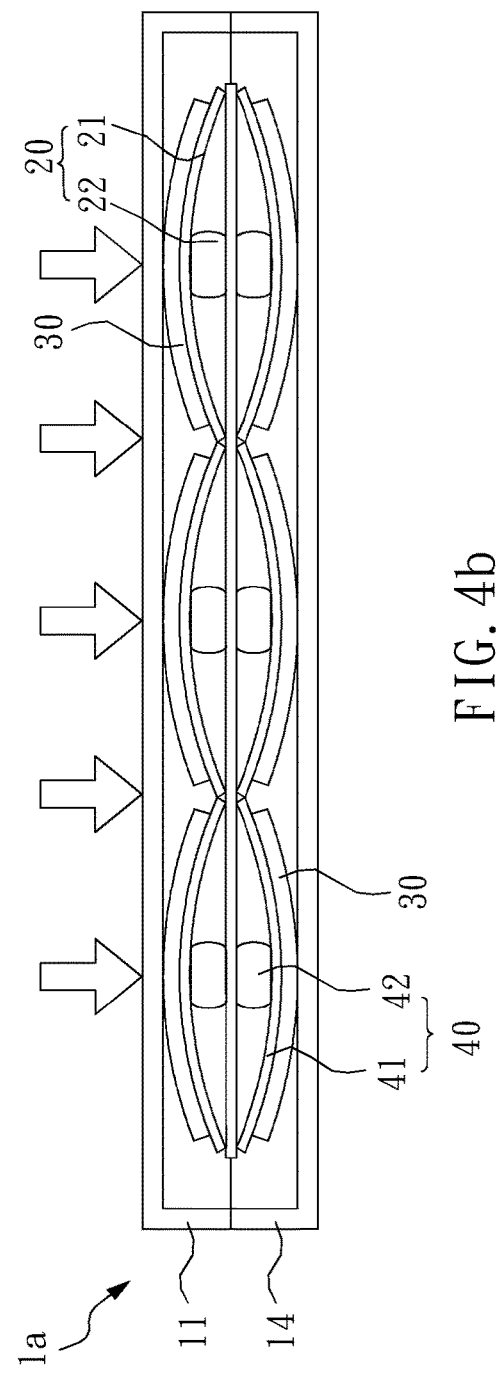
FIG. 4b is a cross-sectional drawing showing the piezoelectric energy harvester being compressed by an external force according to the second embodiment of the present invention.

Hereafter, please refer to FIGS. 3, 4a and 4b for a schematic drawing of a piezoelectric energy harvester, a cross-sectional drawing of the piezoelectric energy harvester in a second embodiment of the present invention, and a cross-sectional drawing showing the piezoelectric energy harvester being compressed by an external force according to the second embodiment of the present invention.

As shown in FIGS. 3, 4a and 4b, in the present embodiment, the piezoelectric energy harvester 1a further includes a plurality of second arc-shaped metal stands 40, and the connection base 12 includes an upper surface 121 and a lower surface 122. Specifically, the plurality of first arc-shaped metal stands 20 are situated on the upper surface 121, and the plurality of second arc-shaped metal stands 40 are situated on the lower surface 122. Each of the arc-shaped piezoelectric elements 30 is located on each of the second arc-shaped metal stands 40. In addition, each of the second arc-shaped metal stands 40 includes a curved plate 41 and a restoring element 42. The opposite ends of the restoring element 42 are connected to the curved plate 41 and the lower surface 122 of each second arc-shaped metal stands 40 respectively. Also, the opposite ends of the restoring element 22 of each first arc-shaped metal stands 20 are connected to the curved plate 21 and the upper surface 121 of each first arc-shaped metal stands 20 respectively.

As shown in FIGS. 3, 4a and 4b, the curved plate 41 of the second arc-shaped metal stands 40 includes a convex surface 411 and a concave surface 412. Specifically, each of the arc-shaped piezoelectric elements 30 is situated on the convex surface 411, and the opposite ends of the restoring element 42 of each second arc-shaped metal stands 40 are connected to the concave surface 412 and the lower surface 122 respectively. It should be noted here that, the deformation of each of the arc-shaped piezoelectric elements 30 and the second arc-shaped metal stands 4 is same as the first embodiment, and will not be repeated herein. Please refer to the relevant paragraphs about the use of the second arc-shaped metal stands 40 in the present invention. Compared to the use of the plurality of first arc-shaped metal stands 20, twice the plurality of arc-shaped piezoelectric elements 30 may be installed. In the premise that Δh is not restricted, the use of the second arc-shaped metal stands 40 can enhance the energy harvesting of the piezoelectric energy harvester 1a.

Figure 5:
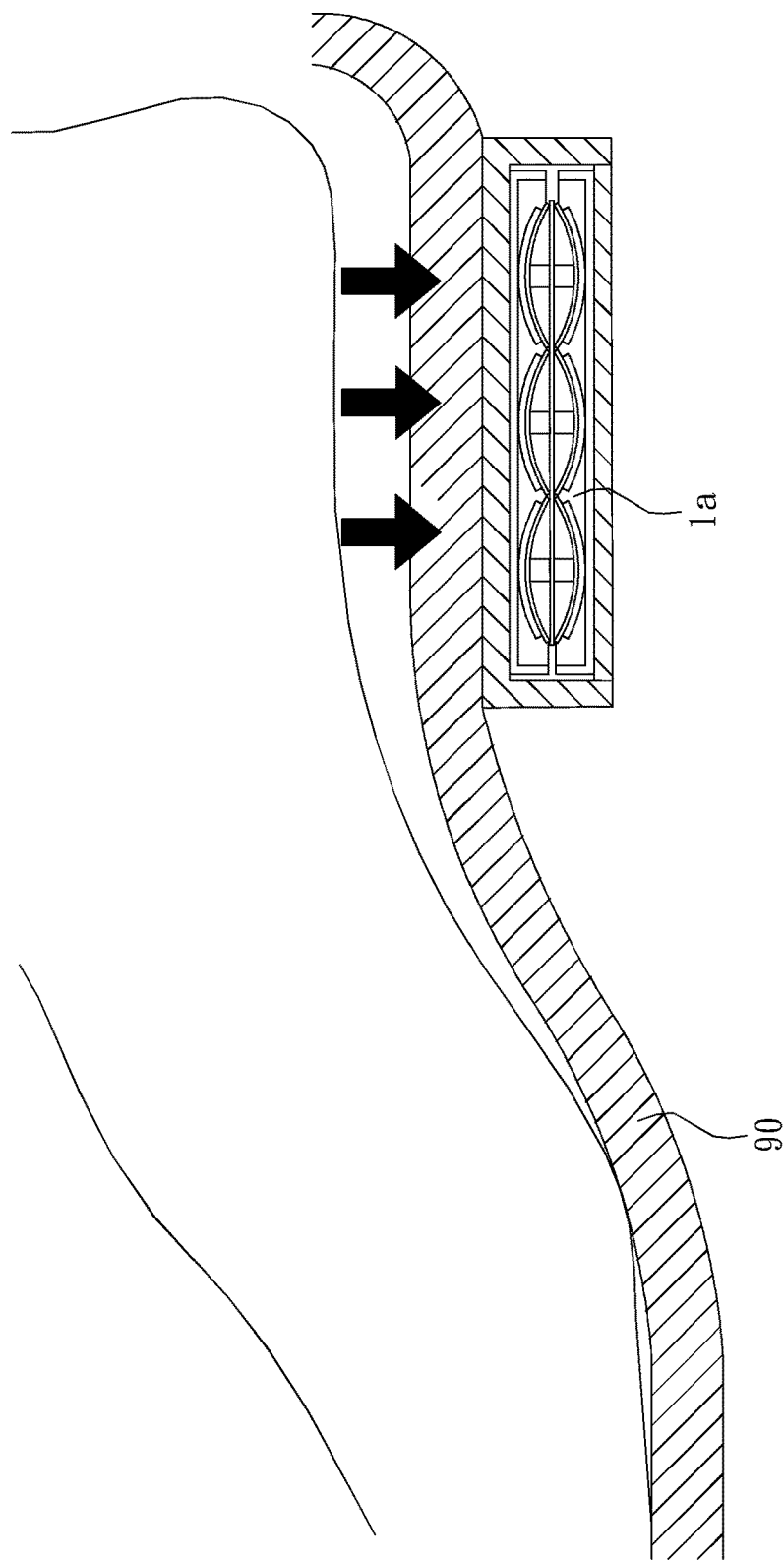
FIG. 5 is a schematic drawing showing the use state of the piezoelectric energy harvester according to the second embodiment of the present invention.

Hereafter, please refer to FIG. 5, which is a schematic drawing showing the use state of the piezoelectric energy harvester according to the second embodiment of the present invention. As shown in FIG. 5, a specific application of the piezoelectric energy harvester 1a in the present invention is a heel of a shoe 90. With each walk, the arc-shaped piezoelectric elements 30 are deformed to generate electricity due to the compression of the heel (piezoelectric energy harvester 1a) caused by the user's foot. It should be noted here that the piezoelectric energy harvester 1 may also be used as a heel. FIG. 5 is illustrative only.

The plurality of arc-shaped piezoelectric elements 30 adapted by the piezoelectric energy harvester 1 and 1a in the present invention can boost the energy harvesting efficiency. Further, the size of the piezoelectric energy harvester 1 and 1a can be designed according to usage requirements. Even in the limited space inside the heel, through the structure where the arc-shaped piezoelectric elements 30 are provided in the arc-shaped metal stands 20 and 40, the mechanical energy can be converted into electricity through the piezoelectric effect as the arc-shaped metal stands 20 and 40 are forced to deform causing the deformation of the arc-shaped piezoelectric elements 30.

It should be noted that the described embodiments are only for illustrative and exemplary, and that various changes and modifications may be made to the described embodiments without departing from the scope of the invention as situated by the appended claims.

What is claimed is:

1. A piezoelectric energy harvester, comprising:
   a box, comprising an upper portion, a connection base, a buffer element and a lower portion, wherein the connection base is situated between the upper portion and the lower portion, and the upper portion is movably connected to the lower portion through the buffer element;
   a plurality of first arc-shaped metal stands, which are situated on a side of the connection base in the box; and
   a plurality of arc-shaped piezoelectric elements, each of which are situated on each of the first arc-shaped metal stands, wherein in the case that an external force is applied to the box, the plurality of first arc-shaped metal stands deforms due to the compression from the upper portion and consequently causes the deformation of the arc-shaped piezoelectric elements for generating electricity accordingly.

2. The piezoelectric energy harvester as claimed in claim 1, wherein each of the first arc-shaped metal stands comprises a curved plate and a restoring element, the opposite ends of the restoring element are connected to the curved plate and the connection base respectively, and the buffer element has a first height, and the restoring element has a second height when the external force is not applied to the box, wherein the first height is greater than the second height.

3. The piezoelectric energy harvester as claimed in claim 2, wherein the curved plate is restored to its original position through the elastic restoring force of the restoring element when the external force is released.

4. The piezoelectric energy harvester as claimed in claim 3, wherein the restoring element is a spring or rubber.

5. The piezoelectric energy harvester as claimed in claim 2, wherein the curved plate comprises a convex surface and a concave surface, each of the arc-shaped piezoelectric elements is situated on the convex surface respectively, and the opposite ends of the restoring element are connected to the concave surface and the connection base respectively.

6. The piezoelectric energy harvester as claimed in claim 1, further comprising a plurality of second arc-shaped metal stands, the connection base having an upper surface and a lower surface, wherein the plurality of first arc-shaped metal stands being situated on the upper surface of the connection base, the plurality of second arc-shaped metal stands being situated on the lower surface of the connection base, and each of the arc-shaped piezoelectric elements being situated on each of the second arc-shaped metal stands.

7. The piezoelectric energy harvester as claimed in claim 6, wherein each of the first arc-shaped metal stands comprises a curved plate and a restoring element, the opposite ends of the restoring element are connected to the curved plate and the upper surface respectively, each of the second arc-shaped metal stands comprises a curved plate and a restoring element, and the opposite ends of the restoring element are connected to the curved plate and the lower surface respectively.

8. The piezoelectric energy harvester as claimed in claim 7, wherein the curved plate has a convex surface and a concave surface, each of the arc-shaped piezoelectric elements is situated on the convex surface, and the opposite ends of the restoring element are connected to the concave surface and the lower surface respectively.

9. The piezoelectric energy harvester as claimed in claim 8, wherein each of the restoring element has a second height as the external force is not applied to the box, and the curved plate is restored to its original position through the elastic restoring force of each the restoring element as the external force is released.

10. The piezoelectric energy harvester as claimed in claim 1, wherein the piezoelectric energy harvester is situated in the heel of a shoe.

\* \* \* \* \*